(12) United States Patent
Gerstmeier et al.

(10) Patent No.: US 6,529,031 B2
(45) Date of Patent: Mar. 4, 2003

(54) INTEGRATED CIRCUIT CONFIGURATION FOR TESTING TRANSISTORS, AND A SEMICONDUCTOR WAFER HAVING SUCH A CIRCUIT CONFIGURATION

(75) Inventors: Günter Gerstmeier, Chapel Hill, NC (US); Valentin Rosskopf, Poettmes (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/876,706

(22) Filed: Jun. 7, 2001

(65) Prior Publication Data

US 2001/0052789 A1 Dec. 20, 2001

(30) Foreign Application Priority Data

Jun. 7, 2000 (DE) .......................... 100 28 145

(51) Int. Cl.⁷ .............................. G01R 31/26
(52) U.S. Cl. ................. 324/769; 324/765; 324/768
(58) Field of Search ................. 324/756, 757, 324/761, 765, 769, 768; 438/14, 18; 257/48

(56) References Cited

U.S. PATENT DOCUMENTS 5,362,671 A * 11/1994 Zavracky et al. .. 148/DIG. 150

FOREIGN PATENT DOCUMENTS

| DE | 198 19 570 A1 | 11/1999 |
| DE | 198 31 563 A1 | 2/2000 |
| EP | 0 430 372 A1 | 6/1991 |

* cited by examiner

Primary Examiner—Michael Sherry
Assistant Examiner—Tung X. Nguyen
(74) Attorney, Agent, or Firm—Laurence A. Greenberg; Werner H. Stemer; Gregory L. Mayback

(57) ABSTRACT

Circuit configurations for testing transistors are arranged in the scribe line between integrated circuits on a semiconductor wafer. In order to increase the number of testable transistors while consuming little surface area, the transistors are arranged in a matrix in at least two rows. The drain-source paths of the transistors in the first row are connected between pads, and their gate connections are connected to a common pad. The drain-source paths of the transistors in the second row are connected firstly to one of the pads, and are secondly jointly connected to a further pad. Their gate connections are likewise connected to a further pad. The matrix-like arrangement of the transistors can be extended by using additional rows.

7 Claims, 2 Drawing Sheets

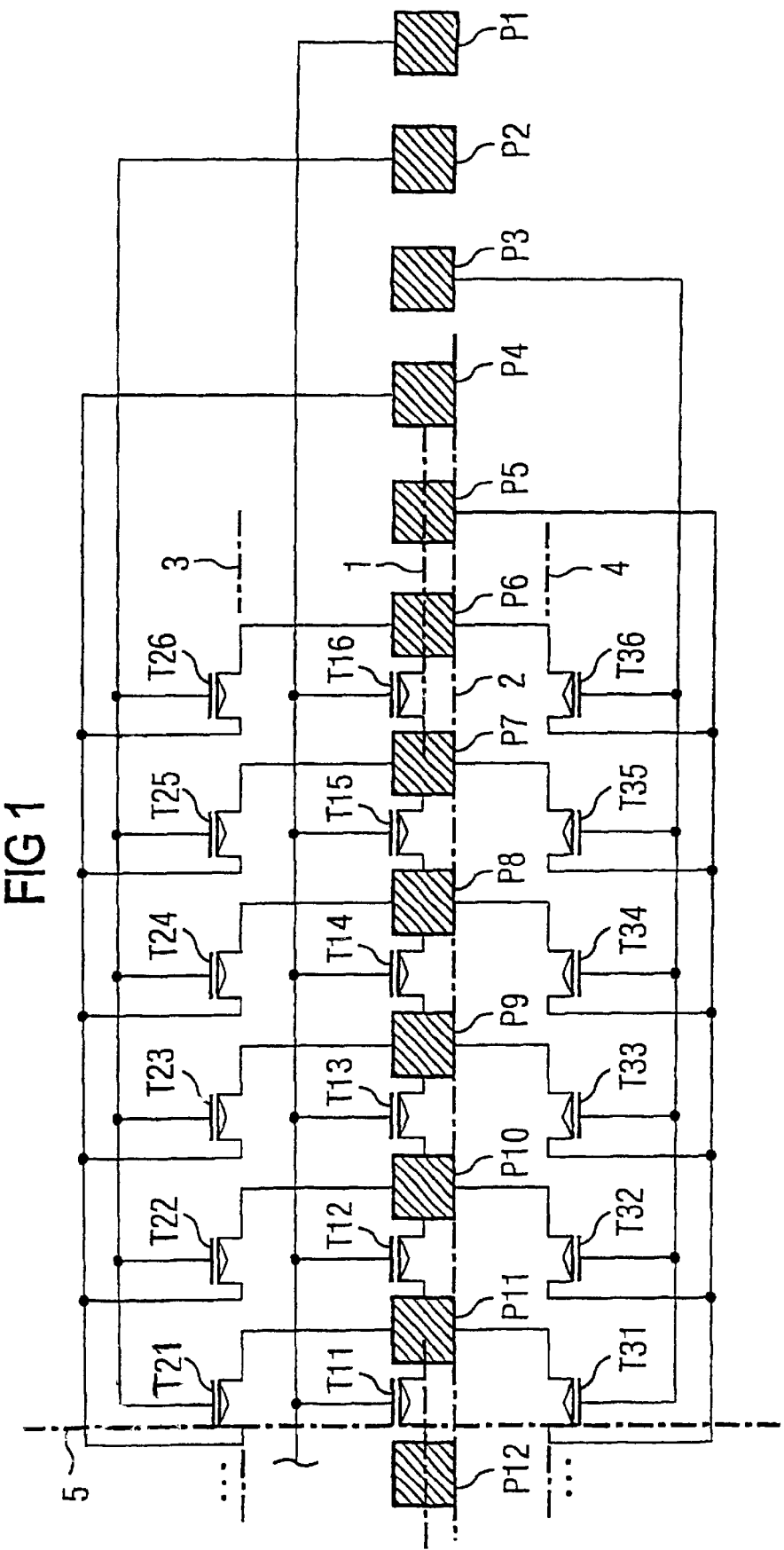

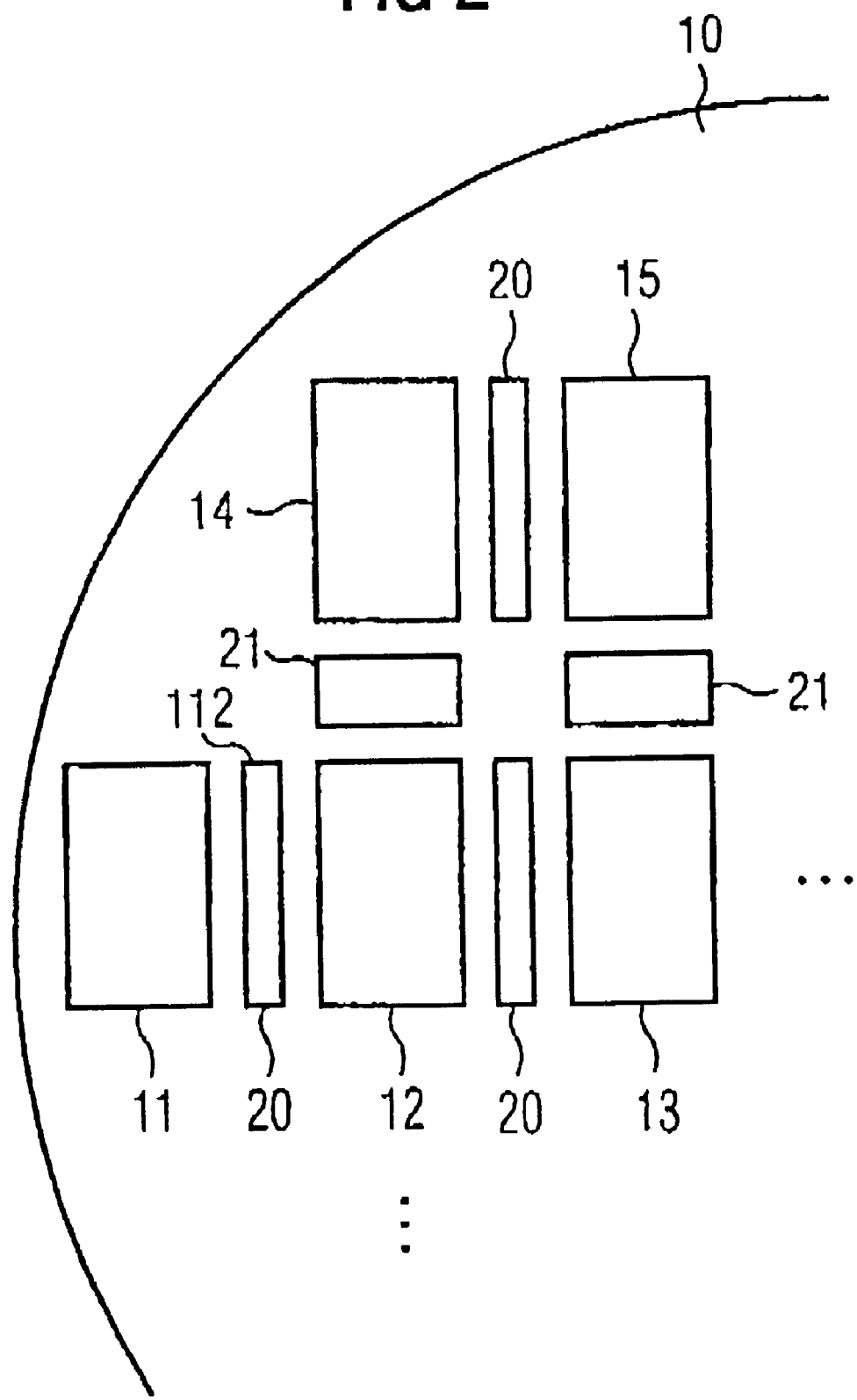

INTEGRATED CIRCUIT CONFIGURATION FOR TESTING TRANSISTORS, AND A SEMICONDUCTOR WAFER HAVING SUCH A CIRCUIT CONFIGURATION

BACKGROUND OF THE INVENTION

FIELD OF THE INVENTION

The invention relates to an integrated circuit configuration for testing transistors having pads to which the transistors are connected.

Integrated circuits are conventionally produced on semiconductor wafers. A multiplicity of circuits, generally of the same type, are thereby arranged on one wafer. The wafer is subjected to a multiplicity of process steps in order to produce the transistors which form the circuits. After various process steps, the mechanical and electrical characteristics of the completed structures and circuits are tested. The wafer is then sawed apart, a process referred to as dicing, in which individual circuits are sawed from one another to produce individual semiconductor platelets, which are referred to as chips. The test circuit configuration which is the subject of this invention is located on the wafer between the individual chips in the scribe line, also referred to as the kerf. The transistors to be tested, which are arranged in the kerf, are accessed via connecting surfaces, which are referred to as pads. The invention also relates to such a semiconductor wafer.

It is always desirable to accommodate as many chips as possible on one wafer. It is thus desirable to keep the space between the chips as small as possible. On the other hand, it is desirable to test as many transistors as possible in order to obtain a sufficiently large number of parameters to allow an assessment that is as comprehensive as possible to be made on the quality of the wafer that has been produced. Further pads are therefore provided in order to test transistors arranged in the kerf. Since the pads are used to accommodate test probes or probe needles from automatic test equipment, they require considerably more surface area than the transistor structure to be tested. The required area increases severely disproportionately for an approximately 1:1 association between the transistors to be tested and the test pads. The desire to utilize available wafer surface area as optimally as possible for usable integrated circuits is contradictory to the need to provide as many test parameter values as possible, and thus the need for as many transistors as possible for testing.

U.S. Pat. No. 5,313,158 (European patent EP-A-0 430 372) discloses a test structure for testing integrated circuits, which is arranged in the kerf of the semiconductor wafer, between the integrated circuits to be tested. Process parameters are derived from the test structures. A multiplexing circuit is provided in order to save bonding pads for these test structures, and couples the various test structures to the same connections.

German patent DE 198 19 570 (corresponding to commonly assigned, copending application Ser. No. 09/302,649) describes a test logic which is arranged in the kerf area of the semiconductor wafer and provides test signals for the semiconductor chip adjacent to the kerf. Further control signals and the supply voltage are supplied via needles to the pads arranged on the integrated circuit.

German patent DE 198 31 563 (corresponding to commonly assigned, copending application Ser. No. 09/353,612) discloses the arrangement of pads in the kerf of a semiconductor wafer, via which test signals can be provided jointly to a number of chips.

SUMMARY OF THE INVENTION

The object of the present invention is to provide an integrated circuit configuration for testing transistors and a semiconductor wafer with such a circuit configuration, which overcomes the above-noted deficiencies and disadvantages of the prior art devices and methods of this general kind, and which occupies as small an area as possible, when in an integrated form, for as many transistors as possible to be tested.

With the above and other objects in view there is provided, in accordance with the invention, an integrated circuit configuration for testing transistors, comprising:

a first multiplicity of pads, a first further pad, a second further pad, and a third further pad;

a multiplicity of transistors to be tested, the transistors each having a control connection and a controlled path between a first connection and a second connection, and the transistors being arranged in a first row and in a second row;

each of the transistors in the first row being arranged between two respective pads of the first multiplicity of pads, and the connections of the controlled path through the transistors being connected to the two pads, and the control connections of the transistors in the first row being connected to the first further pad;

the first connections of the controlled path through the transistors in the second row being each connected to a respective one of the pads, the second connections of the controlled path through the transistors in the second row being jointly connected to the second further pad, and the control connections of the transistors in the second row being jointly connected to the third further pad.

In other words, the objects of the invention are achieved by an integrated circuit configuration for testing transistors, which comprises: a first multiplicity of pads for supplying and tapping off signals, a second multiplicity of transistors to be tested, which are arranged in at least two rows, with one of the transistors in a first row in each case being arranged between two pads and the connections of the controlled path through this transistor being connected to these two pads, and the control connections of all the transistors in the first row being connected to a first further pad, one of the connections of the controlled path through in each case one of the transistors in a second row in each case being connected to a different one of the pads, and the other one of the connections of the controlled path through these transistors being jointly connected to a second further pad, and the control connections of these transistors being jointly connected to a third further pad.

An additional row of transistors to be tested is arranged in the test circuit configuration according to the invention, and these transistors are connected to the test pads which were already present and, furthermore, require only two additional test pads, which are used jointly by these transistors.

Despite doubling the testable transistors by adding a new row of transistors to be tested, the surface area consumed increases only insignificantly since only two further test pads are required. In general, the invention is open in that any desired number of further rows with transistors to be tested are arranged in a corresponding manner. The major advantage is that already existing pads are used more than once. Since pads consume a far greater surface area than additional transistors, the additional surface area requirement is governed essentially only by the additional transistors and the jointly used additional pads. In contrast, the additional wiring complexity is actually reduced. The number of additionally provided rows of transistors to be tested may be limited by the fact that the wiring flexibility is then restricted.

According to a further aspect of the invention, a semiconductor conductor wafer contains the test circuit in the space between the commercially usable integrated circuits. This intermediate space is normally then used in order to saw the usable integrated circuit chips apart from one another, and thus to separate them from one another.

The pads are intended for having test probes from automatic test equipment placed on them, in order to introduce and tap off electrical signals. The automatic test equipment can be configured and programmed appropriately in order to allow it to interact with the test circuit structures according to the invention.

In accordance with an added feature of the invention, the pads and the further pads are arranged along a first straight line, the transistors in the first row are arranged along a second straight line extending parallel to the first straight line, and the transistors in the second row are arranged along a third straight line extending parallel to the first and the second straight lines. In other words, both the pads and the transistors in each row are aligned along respective straight lines. The row of transistors and the arrangement of pads expediently run parallel to one another.

In accordance with an additional feature of the invention, the transistors are field-effect transistors, the controlled path is a drain-source path, and the control connection is a gate connection of the field-effect transistors.

In accordance with another feature of the invention, there is provided at least one further row of further transistors each with a controlled path and a control connection, a fourth further pad, and a fifth further pad. The first connections of the controlled paths through the further transistors are each connected to a respective one of the pads, and the second connections of the controlled paths of the further transistors are jointly connected to the fourth further pad, and the control connections of the further transistors are jointly connected to the fifth further pad.

In accordance with a further feature of the invention, one of the transistors in each of the first, second, and further rows is arranged along a straight line intersecting the straight line along which the pads are arranged.

In accordance with a concomitant feature of the invention, the transistors are arranged in a matrix with rows and columns running transversely to the rows.

With the above and other objects in view there is also provided, in accordance with the invention, a semiconductor wafer, comprising at least two integrated circuits formed on the wafer, and an integrated circuit configuration for testing as outlined above arranged between the at least two integrated circuits on the wafer.

The transistors to be tested are the respective transistors of the type in the integrated circuit. If complementary MOS process technology is used for the production of the wafer, the transistors are MOS field-effect transistors. The transistors have a controlled current path, which has drain and source connections at the ends. The conduction characteristic of this current path can be controlled by a control electrode, the gate. The transistors are arranged like a matrix. This means that there are two straight-line directions along which the transistors are aligned. One of the straight lines runs parallel to the alignment of the pads, as stated above. The other straight line runs transversely with respect to this and cuts the former. The straight lines are preferably at right angles to one another, thus resulting in a matrix-like, checkerboard-like grid structure.

Other features which are considered as characteristic for the invention are set forth in the appended claims.

Although the invention is illustrated and described herein as embodied in an integrated circuit configuration for testing transistors, and a semiconductor wafer having such a circuit configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a detailed view of the circuitry of a test circuit according to the invention; and FIG. 2 is a partial diagrammatic plan view of a semiconductor wafer which has these structures.

DESCRIPTION OF THE PREFERRED EMBODIMENTS

Referring now to the figures of the drawing in detail and first, particularly, to FIG. 1 thereof, there is seen a test structure according to the invention which contains a multiplicity of pads P1, . . . , P12. Pads such as these comprise rectangular or square metallization which is not passivated and is accessible from the surface of the semiconductor chip, for example in order to place a test probe on it. A first row of transistors to be tested comprises the transistors T11, . . . , T16. The drain and source connections of the transistors T11, . . . , T16 are each connected between two immediately adjacent pads. Thus, for example, one of the connections of the drain-source path through the transistor T11 is connected to the pad 12, and the other connections of the drain-source path through the transistor T11 is connected to the pad P11.

The control connections or gate electrodes of the transistors T11, . . . , T16 are jointly connected to a further pad P1. Each of the transistors T11, . . . , T16 can be controlled by an appropriate control voltage, which is injected via the pad P1, so that different parameters can be measured on the various transistors. Often, each of the transistors has a particular configuration, so that an individual process parameter can be measured, allowing appropriate conclusion about the respective behavior during the production of the wafer.

The pads should be designed to be sufficiently large that a test probe can be placed on them deliberately, with the conventional positioning accuracy. In contrast, the transistors occupy less surface area. The structures of the transistors are located between the respective pads to which the drain and source connections of the transistors are connected.

The transistors T11, . . . , T16 have a regular structure and are arranged along an imaginary straight line 1. This means that one characteristic feature of each of the transistors T11, . . . , T16 is aligned with the straight line 1 in the same way. The pads P5, . . . , P12 are preferably of the same size and are arranged along a straight line 2. This means that the same side of the rectangular pad surface is in each case aligned in the same way with the straight line 2. The straight lines 1 and 2 run parallel to one another, so that both the sequence of pads, P6, . . . , P12 and the sequence of transistors T11, . . . , T16 each form a row, with these rows running parallel to one another.

A further row of transistors T21, . . . , T26 is provided, with these transistors being aligned along a straight line 3. One of the connections of the drain-source paths through the transistors T21, . . . , T26 is connected to a respective pad P11, . . . , P6. The respective other connections of the drainsource paths through the transistors T21, . . . , T26 are connected to one another, and are jointly connected to a further pad P4. In the same way, the gate connections of the transistors T21, . . . , T26 are connected to one another, and are jointly connected to a pad P2. In this way, the conductance state of the transistors T21, . . . , T26 can be controlled by injecting a signal at the pad P2. A parameter to be measured can then be tapped off between the pad P4 and the respective other pad P6, . . . , P11 which is connected to the drain-source path of the transistors.

The straight line 3 with which the transistors T21, . . . , T26 are aligned runs parallel to the other straight lines 1 or 2. Furthermore, two transistors, for example the transistors T11 and T21, are each aligned along a further straight line 5, which cuts the straight lines 1, 2 or 3. In the exemplary embodiment, a straight line 5 is at right angles to the straight lines 1, 2, 3. This applies in a corresponding manner to the other transistors T22, . . . , T26 in the second row. This results, overall, in a matrix-like, checker board-like arrangement, in which the same characteristic structure elements of the transistors are in each case located at grid points in a grid network whose grid points are arranged regularly and have connecting lines running at right angles to and/or parallel to one another.

As shown in FIG. 1, the invention can be extended by a third row of transistors T31, . . . , T36. The transistors T31, T36 are aligned along a straight line 4 parallel to the above-mentioned straight lines 1, 2 and 3. In addition, the transistor T31 is aligned along the straight line 5, in the same way as the transistors T11 and T21. The transistors T31, T36 are connected in a corresponding way to the row of transistors T21, . . . , T26, in such a manner that their gate connections are jointly connected to a pad P3, and one connection of their drain-source paths is in each case jointly connected to a pad P5. The other connections of their drainsource paths are each connected to one of the pads P11, P6.

There are no problems whatsoever in arranging further rows of transistors, and in connecting them in a corresponding manner.

The gate connections must each be jointly connected to an additional pad plus, in the same way, a respective one of the connections of their drain-source paths. The other connection of their drain-source paths must in each case be connected to one of the pads P11, . . . , P6. The number of possible further rows of transistors is in practice limited only by the increasing complexity and thus the restricted flexibility in their wiring. The number of transistors and pads which can be arranged in the direction of the straight lines 1, . . . , 4 is virtually unlimited. The invention in this case has the advantage that the existing pads, that is to say the pads P12, . . . , P6, are used more than once for different rows of transistors to be tested. Each additional transistor row requires only two further pads, irrespective of the number of transistors, namely those pads to which their gate connections and one connection of their drain-source path are jointly connected. The additional surface area required for further transistors to be tested is thus governed essentially only by the surface area required for the transistors to be added, which is negligible in comparison with the surface area required for the additional pads.

Referring now to FIG. 2, there is shown a semiconductor wafer 10 having a multiplicity of rectangular integrated circuits, which are sawn apart from one another once the production process and the appropriate tests have been completed. To this end, the semiconductor chips, for example 11, 12, are separated from one another by an intermediate space 112. This intermediate space is referred to as the scribe line or kerf. Each individual one of the integrated circuits 11, 12 etc. is then encapsulated in a pack, in order to be used in an electronic appliance. By way of example, the integrated circuits 11, 12 are integrated semiconductor memories.

Respective test circuit configurations 20, constructed as illustrated in FIG. 1, are arranged in the kerf 112 and in the further kerfs, for example between the chips 12 and 13, as well as 14 and 15. Depending on the test requirements, test circuit configurations 21, constructed as shown in FIG. 1, can also be provided in the horizontal direction in the kerf between the integrated circuits, for example 12 and 14, as well as 13 and 15. The test circuits 20, 21 are used to measure characteristic transistor parameters of widely different types at the end of the production process of the wafer, before being sawn up. Since the test structures are no longer required after this, they are destroyed during the process of sawing up the wafer.

We claim:

1. An integrated circuit configuration for testing transistors, comprising:

a first multiplicity of pads, a first further pad, a second further pad, and a third further pad;

a multiplicity of transistors to be tested, said transistors each having a control connection and a controlled path between a first connection and a second connection, and said transistors being arranged in a first row and in a second row;

each of said transistors in said first row being arranged between two respective pads of said first multiplicity of pads, and said connections of said controlled path through said transistors being connected to said two pads, and said control connections of said transistors in said first row being connected to said first further pad;

said first connections of said controlled path through said transistors in said second row being each connected to a respective one of said pads, the second connections of said controlled path through said transistors in said second row being jointly connected to said second further pad, and said control connections of said transistors in said second row being jointly connected to said third further pad.

2. The integrated circuit configuration according to claim 1, wherein said pads and said further pads are arranged along a first straight line, said transistors in said first row are arranged along a second straight line extending parallel to said first straight line, and said transistors in said second row are arranged along a third straight line extending parallel to said first and said second straight lines.

3. The integrated circuit configuration according to claim 1, wherein said transistors are field-effect transistors, said controlled path is a drain-source path, and said control connection is a gate connection of said field-effect transistors.

4. The integrated circuit configuration according to claim 1, which comprises at least one further row of further transistors each having a controlled path with a first connection and a second connection and a control connection, a fourth further pad, and a fifth further pad, and wherein said first connections of said controlled paths through said further transistors are each connected to a respective one of said pads, and said second connections of said controlled paths of said further transistors are jointly connected to said fourth further pad, and said control connections of said further transistors are jointly connected to said fifth further pad.

5. The integrated circuit configuration according to claim 4, wherein one of said transistors in each of the first, second, and further rows is arranged along a straight line intersecting a straight line along which said pads are arranged.

6. The integrated circuit configuration according to claim 1, wherein said transistors are arranged in a matrix with rows and columns running transversely to said rows.

7. A semiconductor wafer, comprising at least two integrated circuits formed on the wafer, and an integrated circuit configuration according to claim 1 arranged between said at least two integrated circuits on the wafer.

* * * * *